United States Patent [19]

Mattausch

[11] Patent Number: 4,924,443

[45] Date of Patent: May 8, 1990

[54] SEMICONDUCTOR MEMORY COMPRISING A RECOGNITION CIRCUIT FOR SIGNAL CHANGES

[75] Inventor: Hans J. Mattausch, Kirchheim, Fed. Rep. of Germany

[73] Assignee: Siemens Aktiengesellschaft, Berlin and Munich, Fed. Rep. of Germany

[21] Appl. No.: 219,271

[22] Filed: Jul. 15, 1988

[30] Foreign Application Priority Data

Aug. 18, 1987 [DE] Fed. Rep. of Germany ....... 3727548

[51] Int. Cl.⁵ .............................................. G11C 7/00
[52] U.S. Cl. .................................. 365/203; 365/233.5
[58] Field of Search ............. 365/203, 230, 233, 233.5

[56] References Cited

U.S. PATENT DOCUMENTS

4,355,377 10/1982 Sud et al. ............................ 365/203

Primary Examiner—Joseph A. Popek
Attorney, Agent, or Firm—Hill, Van Santen, Steadman & Simpson

[57] ABSTRACT

A semiconductor memory has a recognition circuit for signal changes which deactivates a pre-loading circuit. The pre-loading circuit charges the data lines upon appearance of an address signal change, and then reactivates them again in time-delayed fashion. A clock voltage generator is provided which generates a clock voltage that activates the pre-loading circuit and, given the appearance of an address signal change, switches the clock voltage to a first level that deactivates the pre-loading circuit and, given the appearance of an output signal at the read amplifier, switches this clock voltage to a second level activating the pre-loading circuit.

15 Claims, 4 Drawing Sheets

SEMICONDUCTOR MEMORY COMPRISING A RECOGNITION CIRCUIT FOR SIGNAL CHANGES

BACKGROUND OF THE INVENTION

The invention is directed to a semiconductor memory having a recognition circuit for signal changes which deactivates a pre-charge circuit given appearance of a signal change.

A semiconductor memory of this type is disclosed by EP-A-0 107 415, incorporated herein. In the recognition circuit for signal changes therein, an output signal is derived from every address signal change, this output signal being first supplied to a control input of the pre-charge circuit at which it initiates a deactivation thereof. Secondly, the output signal is supplied via a delay unit to a second control input of the precharge circuit at which it effects a re-activation thereof. The delay unit thus delays the output signal by a fixed time span that must be provided for the most time-consuming memory access.

SUMMARY OF THE INVENTION

An object of the invention is to specify a semiconductor memory of the type initially cited wherein a clocking of the pre-charge circuit derived from signal changes can be adapted significantly better to the actual duration of the individual memory access than is the case in the afore-mentioned, known semiconductor memory.

In the semiconductor memory of the invention, a memory area has a plurality of memory cells connectable via data lines to a write circuit and a read amplifier. The write circuit is connected to a data input and the read amplifier is connected to a data output. An activatable pre-charge circuit is connected for charging in its activated condition the data lines to a prescribed potential. A recognition circuit recognizes signal changes at an input to the semiconductor memory and creates the signal for use in deactivating the pre-charge circuit given appearance of such a signal change. A clock voltage generator is controlled by the recognition circuit and generates a first clock voltage for driving the pre-charge circuit and, depending on when an output from the recognition circuit switches a first clock voltage to a first voltage level upon appearance of the signal change, said first voltage level deactivates the pre-charge circuit. The pre-charge circuit is again activated after a time delay after the appearance of the signal change. The output of the read amplifier is connected to a control circuit for influencing the clock voltage generator dependent on appearance of an output signal at the read amplifier such that the first clock voltage is switched to a second voltage level so as to activate the pre-charge circuit.

The advantage obtainable with the invention is that the re-activation of the pre-charge circuit can occur as soon as possible after the end of every memory access, so that the memory is again available for a new access in the respectively shortest time. A further advantage is that the extremely fast reactivation of the pre-charge circuit is also guaranteed, independently of the plurality of memory cells in the main memory area, and is thus guaranteed independently of the different durations of the memory accesses caused as a result thereof.

DESCRIPTION OF THE PREFERRED EMBODIMENTS

Figures 1, 2:
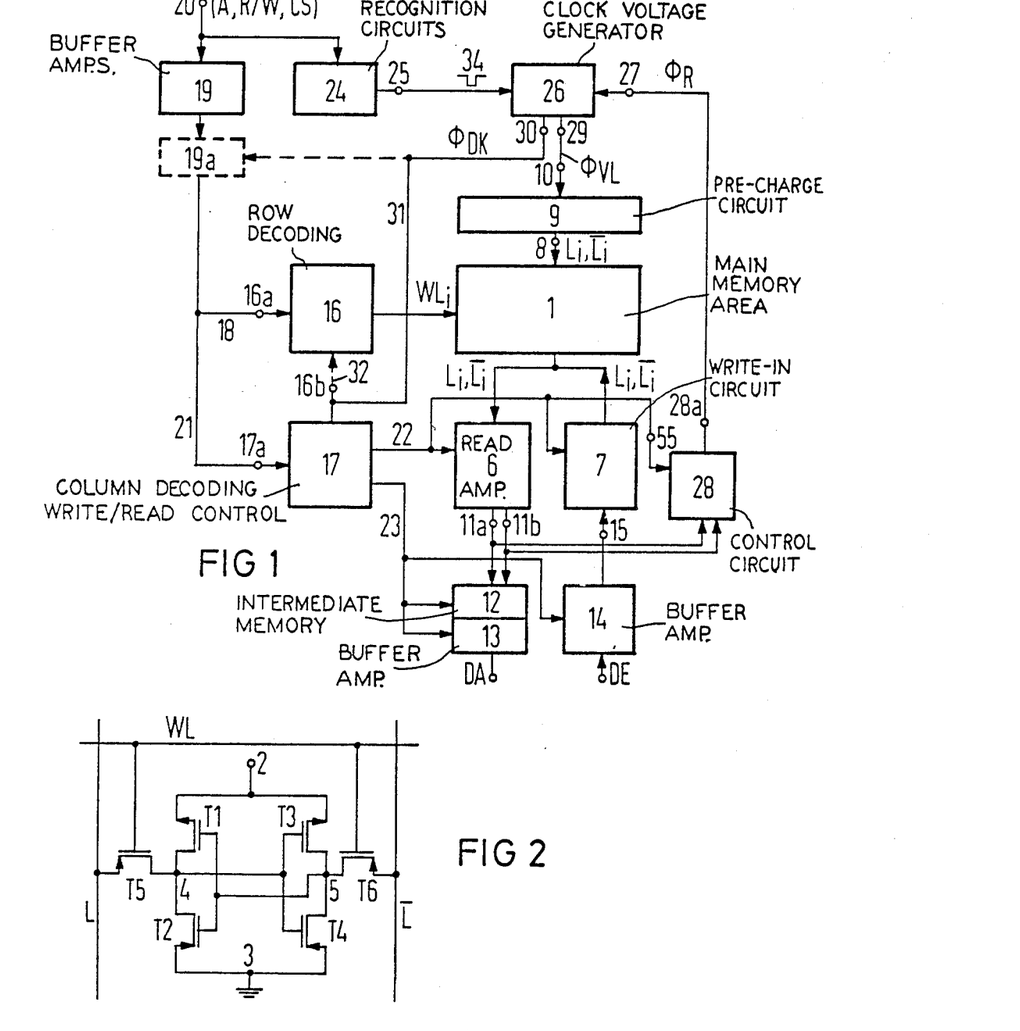
FIG. 1 is a block circuit diagram of a semiconductor memory of the invention.
FIG. 2 is a fundamental circuit of a memory cell of the memory according to FIG. 1.

In FIG. 1, reference numeral 1 references a main memory area that is constructed of a plurality of static memory cells in complementary circuit technology which is designed, for example, in accordance with FIG. 2. According to FIG. 2, each of these memory cells comprises two cross-coupled inverters of which the first is formed of the series circuit of two field effect transistors T1 and T2, and the second is composed of a series circuit of two field effect transistors T3 and T4. The source terminals of the p-channel transistors T1 and T3 are connected to a terminal 2 that is connected to a supply voltage $V_{DD}$ of, for example, five volts. The source terminals of the n-channel transistors T2 and T4 lie at a terminal 3 that is connected to the reference potential $V_{SS}$. The drain terminals of T1 and T2 are connected to one another at a node 4; the drain terminals of the transistors T3 and T4 are connected to one another at a node 5. For realizing the cross-coupling, the gate terminals of T1 and T2 that are connected to one another are connected to the node 5, and the gate terminals of T3 and T4 that are connected to one another are connected to the node 4. The nodes 4 and 5 are each connected to data lines L and $\bar{L}$ via the source-drain paths of n-channel selection transistors T5 and T6. The gates of T5 and T6 are thus driven via a word line WL.

The memory cells in the main memory area 1 are combined in row and column fashion such that all memory cells of a row lie at a common word line WL, whereas all memory cells of a column comprise a common data line pair L, $\bar{L}$. The word lines of all rows of the main memory area 1 are referenced $WL_i$ in FIG. 1; the data line pairs L, $\bar{L}$ of all columns are referenced $L_i$, OVS,/L/ $_i$ therein. The data line pairs $L_i$, $\bar{L}_i$ are connected first to the inputs of a read amplifier 6, and second to the outputs of a write-in circuit 7. Furthermore, they are connected to the outputs 8 of a pre-charge circuit 9 via which they can be charged with a prescribed potential. For example, the pre-charge circuit 9 contains n-channel transistors whose source terminals represent the outputs 8. Their drain terminals are connected with the supply voltage $V_{DD}$. The control terminals of the n-channel transistors are applied to a control input 10. The outputs 11a, 11b of the read amplifier 6 are conducted to a data output DA via an intermediate memory 12 and via a buffer amplifier 13, whereas a data input DE is in communication with an input 15 of the write-in circuit 7 via a buffer amplifier 14. A block 16 represents the row decoding; and a block 17 represents the column decoding and the write/read control of the semiconductor memory.

Given an n-place address signal, i.e. an address signal A comprising n bits, n inputs 16a of the row decoding 16 are connected to n inputs 20 via n lines 18 and n buffer amplifiers 19, and n inputs 17a of block 17 are likewise connected to the inputs 20 via n lines 21 and the buffer amplifiers 19. The outputs of the row decoding 16 are connected to the word lines $WL_i$; the outputs of the column decoding and write/read control block 17 are connected to the circuit units 6, 7, 12, 13 and 14 via output lines 22 and 23. A further line 21 connects a further input 20 at which a write/read signal RW is present at a further input 17a of block 17. Finally, an input 20 is also provided to which a chip select signal CS is supplied and which is connected to additional inputs 16a and 17a via additional lines 18 and 21.

In all, n+2 inputs 20 are provided, these being connected to the inputs of n+2 identically constructed recognition circuits 24 for signal changes whose common output 25 is connected to a first input of a clock voltage generator 26. A second input 27 of the clock voltage generator 26 is connected to the output 28a of a control circuit 28 whose inputs are connected at the outputs 11a and 11b of the read amplifier 6. A first output 29 of generator 26 is connected to the control input 10 of the pre-charge circuit 9, whereas a second output 30 of generator 26 is connected via a line 31 to an input of the column decoding and write/read control 17 and can be additionally connected via a line 32 to an input 16b of the row decoding 16. The output line 22 of control 17 is also connected to a further input of the control circuit 28.

Figure 3:
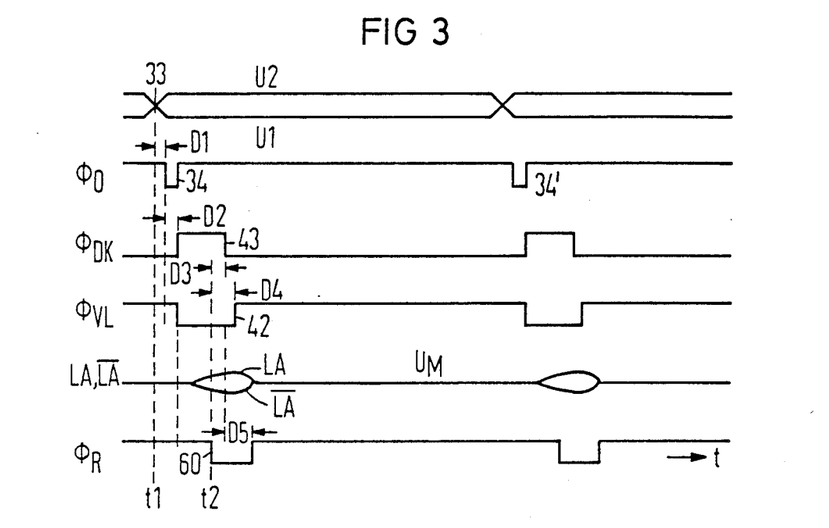
FIG. 3 shows voltage-time diagrams for explaining a functioning of the memory of FIG. 1.

When addressing a memory cell, for example T1 through T6, for the purpose of reading out a signal stored therein via DA, the inputs 20 are supplied with a corresponding address signal A that differs from the address signal which was previously present, so that an address signal change occurs. This is shown in FIG. 3 by the intersection 33 of two voltage curves shown over the time t. The one voltage curve U1 can thus represent one bit of a first address signal that changes from an upper voltage value, for example from a "1", to a lower voltage value, for example a "0", at point in time t1, whereas the other voltage curve U2 illustrates one bit of a second address signal that changes from "0" to "1" at point in time t1.

At least one of the recognition circuits 24 for signal changes creates a pulse-shaped output signal 34 from the address signal change at point in time t1, the trailing edge (change from "1" to "0") of this output signal 34 being delayed by a time span D1 relative to t1. The clock voltage generator outputs a first clock voltage $\phi_{VL}$ at its output 29 preceding the point in time t1, this first clock voltage $\phi_{VL}$ being supplied to the control input 10 of the pre-charge circuit. $\phi_{VL}$ thus exhibits a voltage level "1" which activates the pre-charge circuit 9, so that the data lines $L_i, \overline{L}_i$ are pre-charged to a prescribed potential. After a delay time of D2, the trailing edge of the output signal 34 causes a switching of the first clock voltage $\phi_{DL}$ to a voltage level "0", and thus causes a deactivation of the precharge circuit 9, i.e. the disconnection of the data lines from a voltage source that effects the pre-charging. At the same time, a second clock voltage $\phi_{DK}$ which appears at the output 30 is switched from a voltage level "0" to a voltage level "1". This leads to an activation of the column decoding and write/read circuit 17 and, when an internal clocking of the row decoding is provided, leads to an activation of the row decoding 16. The desired memory cell has thus been addressed and the memory access can be carried out. Since this involves a read-out event, the read amplifier 6 and the circuit units 12 and 13 are also activated in addition to the selection of the data lines, for example L and $\overline{L}$ which belong to the addressed memory cell. This occurs on the basis of the write/read signal R/W which is switched to a first voltage level, whereas the write circuit 7 and the buffer amplifier 14 remain deactivated. The row decoding 16 then does not have to be activated or deactivated by the clock voltage $\phi_{DK}$ when the individual memory cells are dimensioned such that the data lines lying at the voltage source serve the purpose of pre-charging together with a selected word line and such that such a situation cannot lead to a falsification of the stored signals in the memory cells lying at the selected word line.

The control circuit 28 evaluates the readout signal LA, $\overline{LA}$ appearing at the outputs 11A and 11B of the read amplifier 6. It recognizes whether a certain signal amplitude is exceeded. When this is the case, then the output signal $\phi_R$ of the control circuit 28 changes from "1" to "0". According to FIG. 3, this occurs at point in time t2. On the basis of the trailing edge 60 of $\phi_R$, the clock voltage generator 26 is driven via its input 27 such that, following a delay time D3, the clock voltage $\phi_{DK}$ is switched from "1" to "0" and, following a delay time D4 exceeding D3, the clock voltage $\phi_{VL}$ is again switched back from "0" to "1". At the end of the memory access, i.e. when the output signal LA, $\overline{LA}$ disappears, finally the output signal $\phi_R$ is switched from "0" to "1". Thus, the clock voltage generator 26 is again sensitized for signal changes so as to recognize a new output signal 34' of the recognition circuit 24.

Assume that a "1" was stored in the addressed memory cell T1 through T6 before point in time t1. Also assume that the node 4, for example, has the supply voltage $V_{DD}$ thereof and the node 5 lies at reference potential. Further assume that the data lines L and $\overline{L}$ were pre-charged to about half the supply voltage $V_{DD}$ preceding t1. With these conditions, the read-out event sequences such that, given an on state of transistors T5 and T6, the data line $\overline{L}$ is discharged to the reference potential via the transistor T6, and the data line L charges to the supply voltage $V_{DD}$ via the transistor T5, reduced by the n-channel transistor threshold voltage $V_{th}$. The difference between the potentials occurring at the two data lines L and $\overline{L}$ is interpreted in the read amplifier. The difference signal LA-$\overline{LA}$ then appears at the outputs 11a and 11b thereof. The signal LA is indicated in FIG. 3 by a voltage curve exceeding the mean signal value $U_M$, and signal $\overline{LA}$ is indicated therein by a voltage curve falling below $U_M$.

The output signal LA, $\overline{LA}$ proceeds via the outputs 11a, 11b to the intermediate memory 12 and is transmitted via the output thereof and the buffer amplifier 13 to the data output DA. It is available at the data output Da until a new signal appears at the outputs 11a, 11b which is in turn accepted into the intermediate memory 12.

When a signal is to be written into a memory cell, then the feed of the address signal allocated to this memory cell causes an address signal change that again leads to an output signal 34, and, at the chronological spacing of D2 from the trailing edge thereof, to a deactivation of the pre-charge circuit by means of $\phi_{VL}$ as well as to an activation of the blocks 16 and 17 by means of $\phi_{DK}$. This memory cell has thus been addressed. Furthermore, the signal R/W is switched to a second voltage level which identifies a write-in event, so that an output signal 34 of the circuit 24 is generated, even given unaltered address signals A. Due to the second voltage level of R/W, the blocks 6, 7 and 14 are activated, whereas 12 and 13 remain deactivated. The signal to be written in now proceeds via 14, 15, and 7 onto the selected data line pair L, $\overline{L}$ and onto the inputs of the read amplifier 6. This leads to the emission of an output signal LA, $\overline{LA}$ at the outputs 11a and 11b. The control circuit 28 again interprets this output signal in that $\phi_R$ changes from "1" to "0". The trailing edge 60 thus controls the clock voltage generator 26 such that $\phi_{DK}$ is switched back from "1" to "0" and $\phi_{VL}$ is switched back from "0" to "1". When the output signal at 11a and 11b disappears, $\phi_R$ is switched from "0" to "1", so that the clock voltage generator 26 can again recognize a new signal 34' of the circuit 24.

Figure 4:
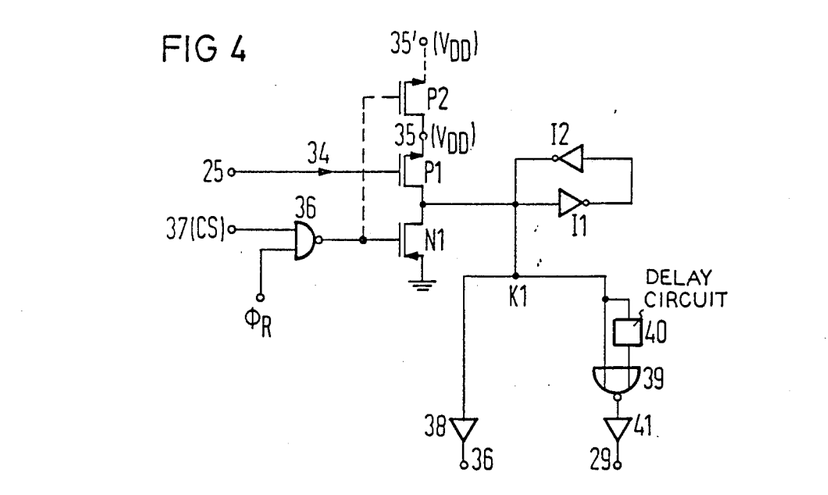
FIG. 4 is a fundamental circuit diagram of a sub-circuit of FIG. 1.

FIG. 4 shows an example of a clock voltage generator 26 in complementary circuit technology. The output signal 34 of the recognition circuit for signal changes is conducted onto the gate of a p-channel transistor P1 whose source has the supply voltage $V_{DD}$ thereat via a terminal 35 and whose drain is connected to an internal node K1. The output signal $\phi_R$ of the control circuit 28 is applied to a first input of a NAND gate 36 whose output is connected to the gate of an n-channel transistor N1. The source and drain of N1 are connected to the reference potential $V_{SS}$ or to the internal node K1. A second input 37 of the gate 36 preferably has a signal CS thereat which is referred to as a "chip select" signal. When CS assumes the value "1", then the semiconductor memory is activated, whereas a value "0" denotes the deactivation of the memory. A hold circuit formed of the inverters I1 and I2 is connected to the node K1. K1 is wired to the output 30 via a buffer amplifier 38, the clock voltage $\phi_{DK}$ being available at this output 30. Furthermore, K1 is directly connected to the first input of a NOR gate 39 and is connected to a second input of gate 39 via a delay circuit 40, for example an inverter chain. The output of gate 39 is conducted to the output 29 via a buffer amplifier 41, the clock voltage $\phi_{VL}$ being taken at this output 29. The circuit parts 39 and 40 yield a delay of the leading edge 42 of $\phi_{VL}$ in comparison to the trailing edge 43 of $\phi_{DK}$, this being necessary in order to assure that the decoding of the memory is disconnected before the pre-charge circuit 9 is cut-in.

The status of the node K1 can be set to "0" or "1" via the transistors N1 and P1. By activating P1, the trailing edge of the output signal 34 thus sets the node K1 to "1". This status can then no longer be altered by further output signals 34. With the node K1 set to "1", $\phi_{VL}$ is set to "0" and $\phi_{DK}$ is set to "1", so that the pre-charge circuit 9 is deactivated and the decodings 16, 17 are activated. On the other hand, the statuses $\phi_R$ equals "0" (control circuit recognizes an output signal LA, $\overline{LA}$ of the read amplifier 6) or CS equals "0" (memory is no longer activated) effect the activation of N1 and a resetting of the node K1 to "0". This results in the status $\phi_{DK}$ equaling "0" and $\phi_{VL}$ equaling "1", and thus results in a deactivation of the decoding and an activation of the pre-charge circuit 9.

Given CS equals "0" or $\phi_R$ equals "0", K1 must be reliably brought into the logical status "0", even given a simultaneously activated transistor P1. This presumes that N1 — in its conductive condition - has a significantly lower resistance between its source and its drain terminals than the transistor P1. Furthermore, N1 and P1 are to be dimensioned such that they deliver noticeably more current than the inverter I2.

In the circuit of FIG. 4, a transverse current, and thus an undesired dissipated power occur, given simultaneously conductive transistors P1 and N1. In order to avoid this, the terminal 35 is preferably connected to a terminal 35' via a p-channel transistor P2, this terminal 35' being connected to the supply voltage $V_{DD}$ instead of terminal 35. The gate of P2 is then connected to the output of the NAND gate 36. P2 serves as a switching transistor that disconnects the supply voltage $V_{DD}$ from the terminal 35 when the transistor N1 is transmissive. The occurrence of a transverse current is thus prevented.

Figure 5:
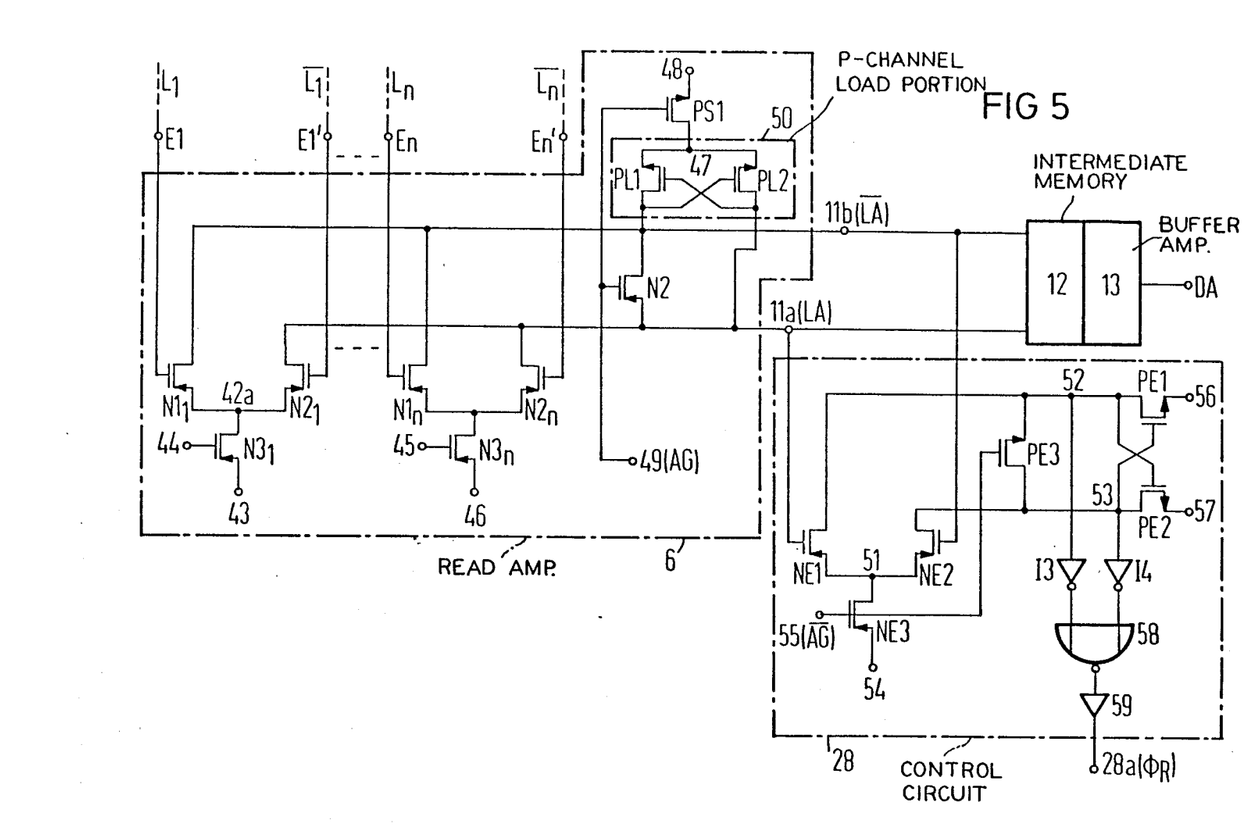
FIG. 5 is a fundamental circuit diagram of another sub-circuit of FIG. 1.

FIG. 5 shows a preferred embodiment of the control circuit 28 and a preferred circuit-oriented design of the read amplifier 6. The read amplifier 6 thus has 2 n data line inputs, the first two of which are referenced E1 and E1' and are connected with the data lines $L_1$ and $\overline{L}_1$ of the first column of the main memory area 1. The inputs $E_n$ and $E_n'$ are connected to the data lines $L_n$ and $\overline{L}_n$ of the $n^{th}$ column. The inputs E1 and E1' have three n-channel transistors $N1_1$, $N2_1$ and $N3_1$ allocated to them, where the first two have their source terminals applied to a node 42a. The drain terminal of $N2_1$ is connected to the output 11a, and the drain terminal of $N1_1$ is connected to the output 11b. The gate of $N1_1$ is connected with the input E1, and the gate of $N2_1$ is connected to the input E1'. The node 42a is connected to the drain terminal of the low end transistor $N3_1$ whose source is applied to reference potential via a terminal 43a. The gate of $N3_1$ is connected to a first output of the column decoding 17 via a terminal 44, a "1" being present at the column decoding 17 when the data line pair $L_1$, $\overline{L}_1$ is selected. In analogous fashion, the further data line inputs of the read amplifier 6 have n-channel transistors allocated to them that are connected to 11a and 11b in corresponding fashion, whereby the gate terminals of the low end transistors each lie at the remaining outputs of the column decoding 17. In FIG. 5, the n-channel transistors allocated to the inputs $E_n$ and $E_n'$ are referenced $N1_n$, $N2_n$, and $N3_n$. The gate terminal of the low end transistor $N3_n$ has reference numeral 45, whereas 46 indicates the source terminal of $N3_n$ lying at reference potential.

The output 11b is connected to the drain terminal of a p-channel transistor PL1 whose source terminal is at a node 47. Analogously thereto, the output 11a is connected to the drain terminal of a p-channel transistor PL2 whose source terminal is connected to the node 47. The gate terminal of PL1 is connected with the drain terminal of PL2, and the gate terminal of PL2 is connected with the drain terminal of PL1. The node 47 is conducted to a terminal 48 via the source/drain path of a further p-channel transistor PS1, this terminal 48 being wired with the supply voltage $V_{DD}$. Furthermore, the outputs 11a and 11b are connected to one another via the source-drain path of an n-channel field effect transistor N2, whereby the gates of PS1 and N2 are applied to a terminal 49. The transistors PL1 and PL2 represent a p-channel load part 50 of the read amplifier 6. According to FIG. 1, an intermediate memory 12 and a buffer amplifier 13 are connected to the outputs 11a and 11b, the output of this buffer amplifier 13 representing the data output DA.

The embodiment of the control circuit 28 shown in FIG. 5 contains three n-channel transistors NE1, NE2, and NE3. The first two have their drain terminals applied to a node 51, whereby the drain terminal of NE1 is at a node 52 and the drain terminal of NE2 is at a node 53. The gate terminal of NE1 is connected to the output 11a, and the gate terminal of NE2 is connected to the output 11b. The node 51 is connected to a terminal 54 via the source-drain path of NE3, this terminal 54 lying at reference potential $V_{SS}$. The gate terminal of NE3 is referenced 55. The node 52 is connected to a terminal 56 via the source-drain path of a p-channel transistor PE1, this terminal 56 being connected with the supply voltage $V_{DD}$. Analogously thereto, the node 53 is connected to a terminal 57 via the source-drain path of a p-channel transistor PE2, this terminal 57 being likewise supplied with the supply voltage. The gate of PE1 is connected to the drain terminal of PE2, and the gate of PE2 is connected to the drain terminal of PE1. The nodes 52 and 53 are connected to one another via the source-drain path of a p-channel transistor PE3 whose gate is applied to the terminal 55. Furthermore, the nodes 52 and 53 are conducted to the inputs of a NOR gate 58 via inverters I3 or I4, the output of this NOR gate 58 being in communication with the output 28a via a buffer amplifier 59.

In the pre-loading phase, i.e. rim $\phi_{VL}=$"1" and $\phi_{DK}=$"0", all low end transistors N3$_1$ through N3$_n$ of the read amplifier 6 are inhibited. The terminal 49 is occupied with a "1", so that the outputs 11a and 11b are shorted via the transistor N2 and the supply voltage $V_{DD}$ is disconnected via the inhibited transistor PS1. The gate terminal 55 of NE3 is occupied with a "0", so that NE3 inhibits and PE3 conducts. The nodes 52 and 53 thus each lie at the potential $V_{DD}-V_t$, whereby $V_t$ denotes the threshold voltage of PE1 or PE2. The inverters I3 and I4 evaluate the potential at 52 or 53 as a respective "1", so that the output signal $\phi_R$ at 28a is likewise "1".

When addressing a memory cell, the low end transistor that belongs to the selected column is activated. The signal present at the terminal 49 is thus switched from "1" to "0". As a result thereof, the outputs 11a and 11b are decoupled from one another, whereby the supply voltage $V_{DD}$ is applied to the node 47 due to the activation of PS1. Furthermore, the signal present at the gate terminal 55 which is inverted relative to the signal present at 49 is switched from "0" to "1". The transistor NE3 is thus activated, whereas the transistor PE3 inhibits. Since the potentials on the selected data lines change in opposite directions dependent on the signal to be read out, that is also true at the outputs 11a and 11b of the read amplifier 6 representing a differential amplifier. The oppositely directed changes in potential appearing there are referenced LA and $\overline{LA}$ in FIG. 3. Since, dependent on the signal to be read out, either LA or $\overline{LA}$ changes in the direction toward the reference potential and a corresponding change in potential also occurs at the node 52 or 53, the threshold of one of the inverters I3 or I4 is thus crossed in a downward direction. The corresponding inverter thus recognizes an input signal "0" and applies a "1" to the input of the following NOR gate 58. The signal $\phi_R$ appearing at the output 28a is thus switched from "1" to "0". This switching, which is indicated by the trailing edge 60 of $\phi_R$ in FIG. 3, causes the transistor N1 to be activated after the expiration of the delay time D3, so that the node K1 (FIG. 4) is set to "0", and thus $\phi_{DK}$ is disconnected. This further results in the inhibiting of the low end transistor of the read amplifier 6 allocated to the selected data line pair. Dependent on the trailing edge 60, on the other hand the clock voltage $\phi_{VL}$ is again switched on after the expiration of the delay time D4. After the expiration of D3, moreover, the transistors N2 and PE3 are activated, so that the difference in potential at the outputs 11a and 11b as well as the nodes 52 and 53 disappears. The potentials at 52 and 53 are set to the value $V_{DD}-V_t$, as a result whereof both inverters I3 and I4 again interpret their input signals as "1", and $\phi_R$ is switched to "1". Due to this switching event, the NAND gate 36 is set to an output signal "0", this leading to the inhibiting of N1. However, the node K1 remains at "0" as long as P1 is likewise inhibited. As a result thereof, the clock voltage generator 26 is again sensitized for the next following output signal 34 since the trailing edge thereof effects an activation of P1, as a result whereof K1 is set to "1". When the switching transistor PS1 is omitted in a read amplifier that is otherwise constructed in accordance with FIG. 5, then the circuit parts NE1 through NE3, PE1 through PE3, and 52, 53, 56 and 57 of the control circuit 28 can likewise be omitted. The input of I3 is directly connected to the output 11a in this case. The input of I4 is also directly connected to 11b.

In a departure from FIG. 5, the load part 50 of the read amplifier 6 can also be designed such that the gates of PL1 and PL2 are connected to one another and are applied to the drain terminal of PL1. On the other hand, the gates of PL1 and PL2 can also be connected to one another and can be conducted to a reference voltage terminal. In this case, however, the simplification of the control circuit 28 set forth in the preceding paragraph is not permitted.

Figure 6:
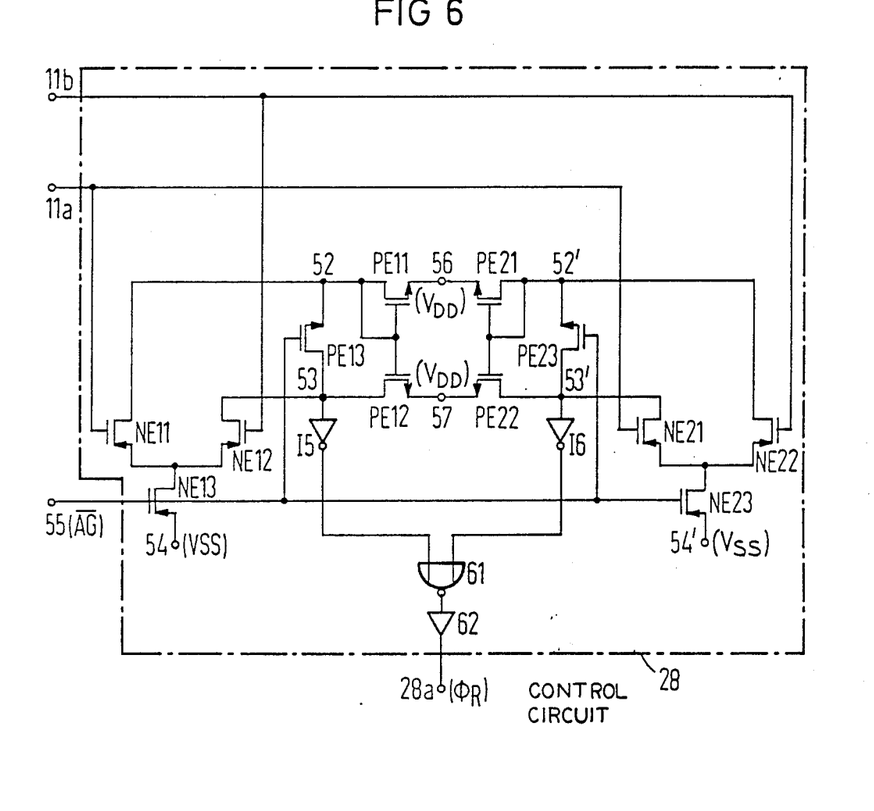
FIG. 6 is an alternative design of the sub-circuit according to FIG. 5.

FIG. 6 shows a further embodiment of the control circuit 28 wherein a bistable circuit design as established by the cross-coupled transistors PE1 and PE2 in FIG. 5 is avoided. A first differential amplifier circuit that largely corresponds in structure to that shown in FIG. 5 is illustrated in the left-hand part of FIG. 6. The n-channel transistors NE11 through NE13 and the p-channel transistors PE11 through PE13 thus correspond to the circuit parts NE1 through NE3 and PE1 through PE3 in FIG. 5. A difference is that the gate terminals of PE11 and PE12 are connected to the drain terminal of PE11. A further difference is that the node 53 is connected to an inverter input but the node 52 is no longer tapped via an inverter input. A second differential amplifier circuit that completely corresponds in structure to the first forms the right-hand part of the circuit of FIG. 6. It contains n-channel transistors NE21 through NE23 and p-channel transistors PE21 through PE23 in a circuit configuration corresponding to the left-hand part of FIG. 6. The gate terminal of NE21 is connected to the output 11a and the gate terminal of NE22 is connected to the output 11b. Furthermore, the source terminal of NE23 lying at reference potential $V_{SS}$ is referenced 54'. The drain terminals of PE21 and PE22 are referenced 52' and 53'. Here, too, only the node 53' is connected with an inverter input, but the node 52' is not. The inputs of two inverters I5 and I6 which correspond to the inverters I3 and I4 of FIG. 5 are connected to the nodes 53 and 53' according to FIG. 6. The outputs of I5 and I6 lie at the inputs of a NOR gate 61 whose output is applied to the output 28a via a buffer amplifier 62.

According to FIG. 6, a pre-loading of the nodes 52 and 53 as well as 52' and 53' to a potential $V_{DD}-V_t$ occurs whereby $V_t$ again denotes the threshold voltage of the transistors PE11 or PE12, or PE21 or PE22. Given read-out of a memory cell, dependent on the stored signal, the potential drops either at the output 11a or 11b of the read amplifier and, accordingly, also at the nodes 53 or 53', whereby either I5 or I6 recognizes the drop in potential as an input signal "0" and supplies a "1" to the following input of the NOR gate 61. This leads to a switching of the signal $\phi_R$ at the output 28 from "1" to "0". Given application of a "1" to the terminal 55, the potentials at the nodes 53 and 53' are again brought to the pre-loading value $V_{DD}-V_t$ via the activated transistors PE13 and PE23, so that the signal $\phi_R$ is switched to the value "1".

The terminals 49 and 55 of the read amplifier or of the control circuit 28 are connected to signals AG or $\overline{AG}$ in FIG. 5 and in FIG. 6. These signals are derived from the clock voltage $\phi_{DK}$ by the column decoding and write-read control 17, and are supplied via the output lines 22. These signals are "1" or "0" given an activated circuit 17, i.e. given $\phi_{DK}=1$, and thus activate the blocks 6 and 28. On the other hand, these signals are "0" or "1" given a deactivated circuit 17, i.e. given $\phi_{DK}=$"0", and thus deactivate the blocks 6 and 28.

In an embodiment of the control circuit according to FIG. 5, disturbances or manufacture-conditioned asymmetries between the transistors NE1 and NE2 or PE1 and PE2 can cause the circuit to assume one of its two stable conditions without having a signal boost occur at the circuit points 11a and 11b. This risk, however, is only present when the transistor PE3 has already been inhibited for a longer time before the appearance of a signal boost at 11a and 11b. This risk is completely suppressed given the circuit of FIG. 6.

The structure of a recognition circuit 24 for signal changes is known, for example, from IEEE Journ. of Solid-State Circuits, Vol. SC-19, October 1984, pages 545 through 551, incorporated herein. In order to employ not only a change in address signal but also a change of the write-read signal R/W supplied to the memory or of the CS signal when that signal is switched from "0" to "1" for the derivation of an output signal 34, identically constructed circuits 24 follow each of the n+2 inputs 20.

In a departure from the embodiments of the read amplifier 6 set forth with reference to FIG. 5, the inputs $E_i$, $\overline{E}i$ can also be connected with the outputs of a preceding amplifier stage instead of being connected to the data lines $L_i$, $\overline{L}_i$. This preceding amplifier stage is in turn connected with the data lines. On the other hand, the read amplifier 6 shown in FIG. 5 can be simplified in the respect that only one n-channel transistor circuit is provided, for example having the transistors N1₁ through N3₁. This is true because the selection of the desired data line pair is already undertaken before the input, for example E1 and E1', of the remaining, single-stage read amplifier, for example in the preceding amplifier stages.

The switching thresholds of the inverters I3 through I6 can be set to a relatively low value of, for example, 1.5 volts in a known way on the basis of the ratio of the channel widths of the p-channel and n-channel transistors contained therein. They are set thereto when the supply voltage $V_{DD}$ amounts to about 5 volts. What is thus achieved is that the pre-loading or biasing potential at the nodes 52, 53, and 53', which is lower than $V_{DD}$ by the threshold voltage $V_t$, is still reliably recognized by the inverters as an input signal "1".

A gate circuit 19a, which is driven by signal $\phi_{DK}$ such that it inhibits during a memory access, can preferably be provided between the output of the buffer amplifier 19 and the inputs 16a and 17a of the row decoding 16 and of the column decoding 17. This prevents further address signals from proceeding to the decoders 16 and 17 during the memory access.

Also of significance in addition to the above-described embodiments of the invention are further embodiments wherein the word width of the memory is greater than 1 bit. Given a word width of m bits, m main memory areas 1, pre-charge circuits 9, read amplifiers 6, write circuits 7, intermediate memories 12, buffer amplifiers 13, 14, and data outputs or data inputs DA, DE are thus provided. The outputs of the blocks 16 and 17 are then each connected to m mutually corresponding word and data lines or read amplifiers, write circuits, intermediate memories, and buffer amplifiers. However, the control circuit 28 is thus preferably connected only to the outputs 11a and 11b of one of the m read amplifiers.

Although various minor changes and modifications might be proposed by those skilled in the art, it will be understood that I wish to include within the claims of the patent warranted hereon all such changes and modifications as reasonably come within my contribution to the art.

I claim as my invention:

1. A semiconductor memory, comprising:
   a memory area having a plurality of memory cells connectable via data lines to a write circuit and a read amplifier;
   the write circuit being connected to a data input and the read amplifier being connected to a data output;
   an activatable pre-charge circuit means connected for charging the data lines to a prescribed potential when the pre-charge circuit means is activated;
   a recognition circuit means for recognizing a signal change at an input to the semiconductor memory and for providing an output signal for use in deactivating the pre-charge circuit means given appearance of said signal change;
   a clock voltage generator means controlled by said output signal from said recognition circuit means for generating a first clock voltage for controlling the pre-charge circuit means, and said clock voltage generating means deactivating the pre-charge circuit means by switching the first clock voltage to a first voltage level in response to said signal change; and
   an output of the read amplifier connecting to a control circuit means for controlling the clock voltage generator means by providing a control signal thereto when an output signal at the read amplifier exceeds a given level to cause said clock voltage generator means to switch said first clock voltage after a given time delay to a second voltage level for activating the pre-charge circuit means.

2. A semiconductor memory according to claim 1 wherein said control circuit means permits the clock voltage generator means to respond to said output signal from said recognition circuit means when said output signal of the read amplifier is not present.

3. A semiconductor memory according to claim 1 wherein a column decoding means is provided connected to said read amplifier and write circuit, and said clock voltage generator means generating a second clock voltage which, when switched to a second voltage level activates said column decoding means approximately when the first clock voltage switches to the first voltage level, and said second clock voltage deactivating the column decoding means by switching to a first voltage level approximately when the first clock voltage switches to the second voltage level.

4. A semiconductor memory according to claim 3 wherein a row decoding means is provided connected to said memory cells in said memory area, and wherein said clock voltage generating means second clock voltage is connected to activate the row decoding means.

5. A semiconductor memory according to claim 3 wherein a row decoding means is connected to said memory area, and wherein inputs of said row decoding means and column decoding means re connected with address signals from a gate circuit means, said gate circuit means being driven with said second clock voltage such that said gate circuit means prevents the address signals from being input to the decoding means during presence of said second voltage level of said second clock voltage.

6. A semiconductor memory according to claim 1 wherein an intermediate memory is connected following said read amplifier, and wherein a write/read control means is provided for activating the read amplifier and said intermediate memory given a read-out event, and given a write-in event, activates said read amplifier together with the write circuit but without activating the intermediate memory.

7. A semiconductor memory according to claim 1 wherein said clock voltage generator means comprises:
a second clock voltage in addition to the first clock voltage, said second clock voltage connecting to a column decoding means connected to said read amplifier and write circuit, and wherein said clock voltage generator means contains first and second field effect transistors of differing channel types whose drain terminals are connected to a first node, a source terminal of the first field effect transistor connecting to a supply voltage and a source terminal of the second field effect transistor connecting to a reference potential;
a gate terminal of the first field effect transistor being an input of the clock voltage generator means connected to said recognition circuit means for signal changes;
a gate terminal of the second field effect transistor being an input of said clock voltage generator means connected to said control circuit means;
said first node also connecting to a first input of a NOR gate and is also connected via a delay circuit to a second input of the NOR gate; and
an output of the clock voltage generator means at which said first clock voltage is present being connected to an output of said NOR gate and a second output of the clock voltage generator means at which said second clock voltage is present being connected to said first node.

8. A semiconductor memory according to claim 7 wherein said gate terminal of said second field effect transistor being connected to an output of a NAND gate whose first input is the input of the clock voltage generator means connected to the control circuit means and whose second input is connected with a chip select signal.

9. A semiconductor memory according to claim 7 wherein the gate terminal of the second field effect transistor is connected to a gate terminal of a third field effect transistor of the same channel type as the first field effect transistor and whose source/drain path is connected between the source terminal of the first field effect transistor and a supply voltage terminal.

10. A semiconductor memory according to claim 7 wherein said first node connects to a hold circuit formed of two cross-coupled inverters.

11. A semiconductor memory according to claim 1 wherein said control circuit means comprises:
first, second, and third field effect transistors;
the first and second transistors having their gates respectively connected to first and second outputs of the read amplifier;
the first and second transistors being connected via their drain terminals to first and second respective nodes and via their source terminals to a drain terminal of said third field effect transistor, said third field effect transistor having its source connected to reference potential and its gate terminal at a control input;
the first and second nodes being connected to first and second terminals via source/drain paths of fourth and fifth field effect transistors, said first and second terminals being connected to a supply voltage;
a gate terminal of the fourth transistor connecting to a drain terminal of the fifth transistor and a gate terminal of the fifth transistor connecting to a drain terminal of the fourth transistor;
the first and second circuit nodes being connected to one another via a compensation transistor whose gate is connected to said control input, a source of which connects through a first inverter to a first input of a NOR gate, and a drain terminal of which connects through a second inverter to a second input of the NOR gate; and
an output of the NOR gate being an output of the control circuit means.

12. A semiconductor memory according to claim 11 wherein said output of the control circuit means connects to an input of said clock voltage generator means.

13. A semiconductor memory according to claim 1 wherein said control circuit means comprises:
first, second, and third field effect transistors of first channel type, respective gate terminals of said first and second field effect transistor being connected to first and second outputs of the read amplifier respectively;
a drain terminal of the first field effect transistor connecting to a first internal circuit node and a drain terminal of the second field effect transistor connecting to a first output node;
source terminals of the first and second field effect transistors connecting to a drain terminal of said third field effect transistor whose source terminal connects to reference potential and whose gate terminal is at a control input;
a first compensation transistor whose source/drain path connects the first internal node to the first output node, and whose gate connects to said control input;
fourth and fifth field effect transistors of second channel type, the fourth transistor source/drain path being connected between said first internal circuit node and a supply voltage and a source/drain path of said fifth transistor connecting between said first output node and supply voltage, gates of said fourth and fifth transistors connecting to said first internal circuit node;
sixth, seventh, and eighth field effect transistors of first conductivity type;

the sixth and seventh transistors having their gate terminals connecting to said two outputs of the read amplifier;

the sixth transistor drain terminal connecting to a second output node and the drain terminal of the seventh transistor connecting to a second internal circuit node;

source terminals of the sixth and seventh transistors connecting to a reference potential through a source/drain path of said eighth transistor whose gate terminal connects to said control input;

a second compensation transistor whose source/drain path connects between said second internal circuit node and said second output node, and whose gate connects to said control input;

ninth and tenth field effect transistors of second conductivity type;

the ninth transistor source/drain path connecting between the second internal circuit node and supply voltage and a source/drain path of the tenth transistor connecting between the second output node and supply voltage, gate terminals of the ninth and tenth transistors being connected to said second internal circuit node;

the first and second outputs connecting through respective inverters to first and second inputs of a NOR gate; and an output of the NOR gate connecting to an output of the control circuit.

14. A semiconductor memory, comprising:

a memory area having a plurality of memory cells connectable via data lines to a write circuit connected with a data input and a read circuit connected with a data output;

a pre-charge circuit means connected for charging the data lines to a prescribed potential when the pre-charge circuit means is activated;

a recognition circuit means for recognizing a signal change at a control input to the semiconductor memory;

a clock voltage generator means connected to said recognition circuit means for generating a first clock voltage for controlling the pre-charge circuit means, and said clock voltage generator means deactivating the pre-charge circuit means by switching the first clock voltage to a first voltage level in response to said signal change; and an output of the read circuit connecting to a control circuit means for controlling the clock voltage generator means by providing a control signal thereto when an output signal at the read circuit exceeds a given level to cause said clock voltage generator means to switch said first clock voltage to a second voltage level for activating the pre-charge circuit means.

15. A semiconductor memory according to claim 14 wherein said clock voltage generator means also generates a second clock voltage for activating said write and read circuits, and wherein said control signal provided by the control circuit means also causes said clock voltage generator means to change a logic level of said second clock voltage so as to deactivate said write and read circuits.

* * * * *